(12) United States Patent
Purayath et al.

(10) Patent No.: US 8,193,055 B1
(45) Date of Patent: Jun. 5, 2012

(54) METHOD OF FORMING MEMORY WITH FLOATING GATES INCLUDING SELF-ALIGNED METAL NANODOTS USING A POLYMER SOLUTION

(75) Inventors: Vinod Robert Purayath, Santa Clara, CA (US); George Matamis, San Jose, CA (US); Takashi Orimoto, Sunnyvale, CA (US); James Kai, Santa Clara, CA (US); Tuan D. Pham, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 1203 days.

(21) Appl. No.: 11/958,875

(22) Filed: Dec. 18, 2007

(51) Int. Cl.
*H01L 21/336* (2006.01)

(52) U.S. Cl. ........ 438/257; 438/261; 438/264; 438/594; 977/720; 977/810; 257/E21.21; 257/E21.423

(58) Field of Classification Search .................. 438/257, 438/261, 287–288, 593, 962; 977/720, 943
See application file for complete search history.

(56) References Cited

U.S. PATENT DOCUMENTS

| | | | |
|---|---|---|---|
| 6,407,424 B2 * | 6/2002 | Forbes | 257/315 |
| 6,646,302 B2 | 11/2003 | Kan et al. | |
| 6,656,792 B2 | 12/2003 | Choi et al. | |
| 6,859,397 B2 | 2/2005 | Lutze et al. | |
| 6,913,984 B2 | 7/2005 | Kim et al. | |
| 6,917,542 B2 | 7/2005 | Chen et al. | |
| 6,927,136 B2 | 8/2005 | Lung et al. | |
| 6,991,984 B2 | 1/2006 | Ingersoll et al. | |
| 7,045,851 B2 | 5/2006 | Black et al. | |
| 7,119,395 B2 | 10/2006 | Gutsche et al. | |
| 7,138,680 B2 | 11/2006 | Lee et al. | |
| 7,173,304 B2 | 2/2007 | Weimer et al. | |
| 7,259,984 B2 | 8/2007 | Kan et al. | |
| 2004/0130941 A1 | 7/2004 | Kan et al. | |
| 2004/0256662 A1 * | 12/2004 | Black et al. | 257/317 |
| 2005/0112820 A1 | 5/2005 | Chen et al. | |
| 2005/0122775 A1 | 6/2005 | Koyanagi et al. | |
| 2005/0258470 A1 | 11/2005 | Lojek et al. | |
| 2005/0287717 A1 * | 12/2005 | Heald et al. | 438/128 |

(Continued)

OTHER PUBLICATIONS

H. Komatsu et al., "Applying Nanotechnology to Electronics—Recent Progress in Si-LSIs to Extend Nano-Scale," Science and Technology Trends—Quarterly Review, Jul. 2005.

(Continued)

*Primary Examiner* — Thanh Nguyen
(74) *Attorney, Agent, or Firm* — Vierra Magen Marcus & DeNiro LLP

(57) ABSTRACT

Techniques are provided for fabricating memory with metal nanodots as charge-storing elements. In an example approach, metal salt ions are added to a core of a copolymer solution. A metal salt reduction causes the metal atoms to aggregate in the core, forming a metal nanodot. The copolymer solution is applied to a gate oxide on a substrate using spin coating or dip coating. Due to the copolymer configuration, the nanodots are held in a uniform 2D grid on the gate oxide. The polymers are selected to provide a desired nanodot size and spacing between nanodots. A polymer cure and removal process leaves the nanodots on the gate oxide. In a configuration using a control gate over a high-k dielectric floating gate which includes the nanodots, the control gates may be separated by etching while the floating gate dielectric extends uninterrupted since the nanodots are electrically isolated from one another.

24 Claims, 7 Drawing Sheets

U.S. PATENT DOCUMENTS

| | | | |
|---|---|---|---|
| 2006/0014329 A1 | 1/2006 | Park et al. | |
| 2006/0040103 A1 | 2/2006 | Whiteford et al. | |
| 2006/0284241 A1 | 12/2006 | Kim | |
| 2007/0029600 A1 | 2/2007 | Cohen | |
| 2007/0032091 A1 | 2/2007 | Heald et al. | |
| 2007/0034933 A1 | 2/2007 | Kim et al. | |
| 2007/0105316 A1 | 5/2007 | Jeng | |
| 2007/0176223 A1* | 8/2007 | Chindalore et al. | 257/314 |
| 2007/0224813 A1 | 9/2007 | Shen et al. | |
| 2009/0085094 A1* | 4/2009 | Lee et al. | 257/321 |

OTHER PUBLICATIONS

K. W. Guarini et al., "Low voltage, scalable nanocrystal FLASH memory fabricated by templated self assembly," IEEE Int. Electron Devices Meeting Tech. Digest, vol. 22, issue 2, pp. 1-4, Dec. 2003.
IBM Research: Press Resources, "IBM demos new nanotechnology method to build chip components," Dec. 8, 2003.
U.S. Appl. No. 11/958,941, filed Dec. 18, 2007, titled "Method of Forming Memory With Floating Gates Including Self-Aligned Metal Nanodots Using a Coupling Layer".

* cited by examiner

METHOD OF FORMING MEMORY WITH FLOATING GATES INCLUDING SELF-ALIGNED METAL NANODOTS USING A POLYMER SOLUTION

BACKGROUND OF THE INVENTION

1. Field of the Invention

The present invention relates to memory having charge-storing nanodots.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," issued Jul. 12, 2005; both of which are incorporated herein by reference in their entirety.

Recent fabrication techniques allow the floating gate of a non-volatile memory to be formed from nanodots, e.g., small charge-storing particles. Such techniques have gained interest as memory device dimensions continue to scale down. However, existing techniques have not been satisfactory in providing nanodots which have a uniform size and alignment, and which can be easily used with existing fabrication techniques.

SUMMARY OF THE INVENTION

The present invention provides a method for fabricating memory having charge-storing, self-aligned metal nanodots by applying the nanodots to a substrate in a polymer solution. In an example implementation, the nanodots are used in a floating gate of non-volatile memory. However, the technique is suitable for volatile memory as well, such as DRAM.

In one embodiment, a method for fabricating a memory device includes applying a polymer solution to a substrate, where the polymer solution includes a copolymer with metal particles carried in cavities of the copolymer. The method further includes removing at least a portion of the polymer solution from the substrate, leaving the metal particles on the substrate, and forming memory elements on the substrate in which the metal particles are charge-storing elements.

In another embodiment, multiple layers of nanodots are used. A method for fabricating a memory device includes a) forming a first layer of metal particles on a substrate, where the metal particles in the first layer are carried in cavities of a polymer solution, and b) removing at least a portion of the polymer solution in which the metal particles in the first layer are carried, leaving the first layer of metal particles on the substrate. The method further includes c) providing a first floating gate sublayer above the substrate which encompasses the first layer of metal particles, at least in part, and d) forming a second layer of metal particles above the first floating gate sublayer, where the metal particles in the second layer are carried in cavities of a polymer solution. The method further includes e) removing at least a portion of the polymer solution in which the metal particles in the second layer are carried, leaving the second layer of metal particles above the first floating gate sublayer, f) providing a second floating gate sublayer above the first floating gate sublayer which encompasses the second layer of metal particles, at least in part, and g) forming non-volatile storage elements on the substrate, where the first and second layers of metal particles are provided in floating gates of the non-volatile storage elements.

In another embodiment, a method for fabricating a memory device includes adding metal salt ions to cavities in a polymer solution, and reducing the metal salt ions to form charge neutral metal particles in the cavities. The method further includes coating a substrate with the polymer solution so that the charge neutral metal particles are spaced apart and arranged in a uniform grid on the substrate, removing at least a portion of the polymer solution by curing, thereby leaving the charge neutral metal particles arranged in the uniform grid on the substrate, and forming storage elements on the substrate, each where each storage element includes, on average, at least one of the metal particles.

Corresponding semiconductor materials and memory devices may also be provided.

DETAILED DESCRIPTION

The present invention provides a method for fabricating memory having charge-storing, self-aligned metal nanodots by applying the nanodots to a substrate in a polymer solution.

In a storage element, nanodots can be used to store charge (e.g., electrons). The use of nanodots as charge-storing particles in memory such as non-volatile memory provides many advantages, including allowing reduced programming voltages, resulting in reduced power/current consumption in the memory device, and scaling to ever smaller dimensions in future generation memory devices. Further, nanodots are compatible with conventional fabrication techniques and materials.

During fabrication, a 2D array of nanodots is formed on a substrate with a uniform nanodot size and alignment. Vacuum deposition techniques such as sputtering and evaporation may not be adequate in controlling the alignment of the nanodots and may allow the nanodots to pile up on the edges of steps and/or trenches on the substrate. An improved technique involves the utilization of self-assembling materials which have an ability to generate spatially regular structures. For example, polymer micelle technology may be employed to form metal nanodots with a high degree of uniformity. Such technology can be used to successfully fabricate self-aligned metal nanodots with sizes, e.g., from a few nm to about 30 nm. In one example, the nanodots are metal particles which are generally spherical and have a diameter of about 1 to 30 nm. Although, other sizes and shapes can be used as well.

In an example implementation, the polymer micelle technology involves forming a copolymer solution, adding a metal salt to provide metal salt ions in a core or micelle, e.g., cavity, of the copolymer, and performing a metal salt reduction to form a metal nanodot in the core. The copolymer solution with the metal nanodots can be readily deposited onto a substrate by conventional spin-coating or dip-coating techniques, and the remainder of the memory device can subsequently be fabricated. Further, the size and spacing of the metal nanodots can be tailored based on the molecular weight of the block copolymer and the amount of the metal salt used. That is, the two polymers which constitute the copolymer can be selected to achieve a specific nanodot size and spacing. The amount of charge that be stored by a nanodot depends on its size, which is a function of the copolymer ratio that has been used to form the micelle.

Applying Nanodots Using Polymer Solution

Figure 1:
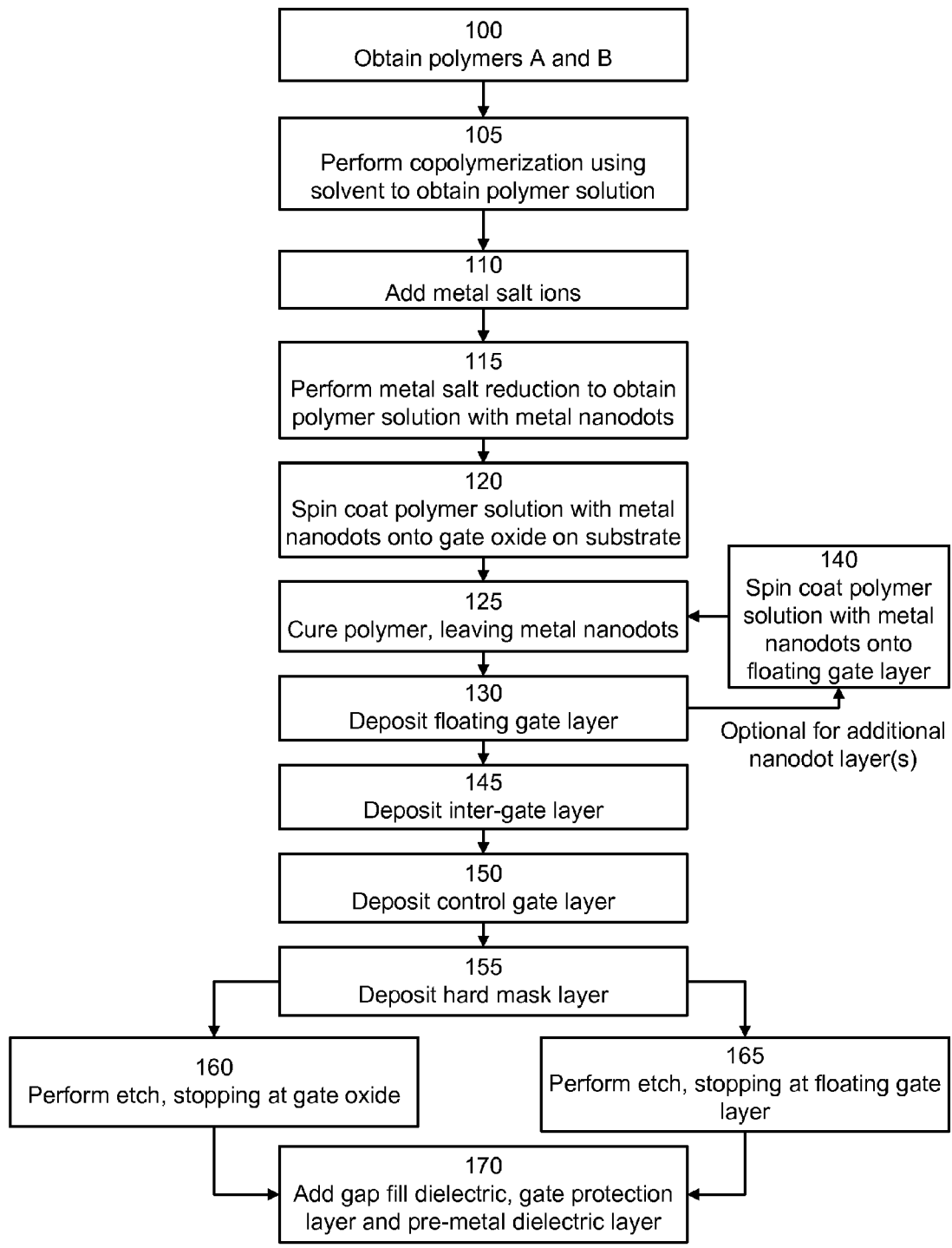
FIG. 1 depicts one embodiment of a process for forming memory having charge-storing nanodots.

FIG. 1 depicts one embodiment of a process for forming memory having charge-storing nanodots. Step 100 includes obtaining first and second polymers referred to as polymers A and B, respectively. Step 105 includes performing copolymerization using a solvent to obtain a polymer solution comprising a copolymer. A copolymer is a product of copolymerization, which refers to the polymerization of two substances (as different monomers, or small molecules) together. Polymerization involves a chemical reaction in which two or more molecules combine to form larger molecules that contain repeating structural units. Step 110 includes adding metal salt ions. Step 115 includes performing a metal salt reduction to obtain a polymer solution with metal nanodots in the cores of the copolymer. Step 120 includes spin coating the polymer solution with the metal nanodots onto a gate oxide on a substrate. Step 125 includes curing the polymer, leaving the metal nanodots on the gate oxide.

Once the nanodots have been deposited on the gate oxide, further fabrication techniques can be employed to complete the memory device. For example, step 130 includes depositing a floating gate layer, step 145 includes depositing an optional inter-gate dielectric material, step 150 includes depositing a control gate layer and step 155 includes depositing a hard mask layer. Optionally, multiple layers of nanodots can be provided as indicated at step 140 by spin coating additional polymer solution to the previously applied floating gate layer/sublayer, and repeating steps 125 and 130. Another option is to deposit an additional oxide layer, in which case the additional polymer solution is applied to the additional oxide layer. This process can be repeated multiple times, if desired, to provide multiple additional layers of nanodots.

Once the hard mask layer has been applied at step 155, the layered material is etched to form memory elements. In one approach, at step 160, the etch stops at the gate oxide so that a separate stack is formed for each memory element, including a separate floating gate and control gate. In another approach, at step 165, the etch stops at or near the top of the floating gate layer, or at the inter-gate layer, which is between the floating gate layer and the control gate layer, so that the control gates of the memory elements are separated from one another but the floating gates remain connected in a continuous nanodot-populated layer. Step 170 includes adding a gap fill dielectric such as TEOS (tetraethyl orthosilicate), a gate protection later such as SiN (silicon nitride) and a pre-metal dielectric layer such as BSPG (borophosphosilicate glass), in one example implementation. Further details of the process of FIG. 1 are discussed next.

Figure 2:
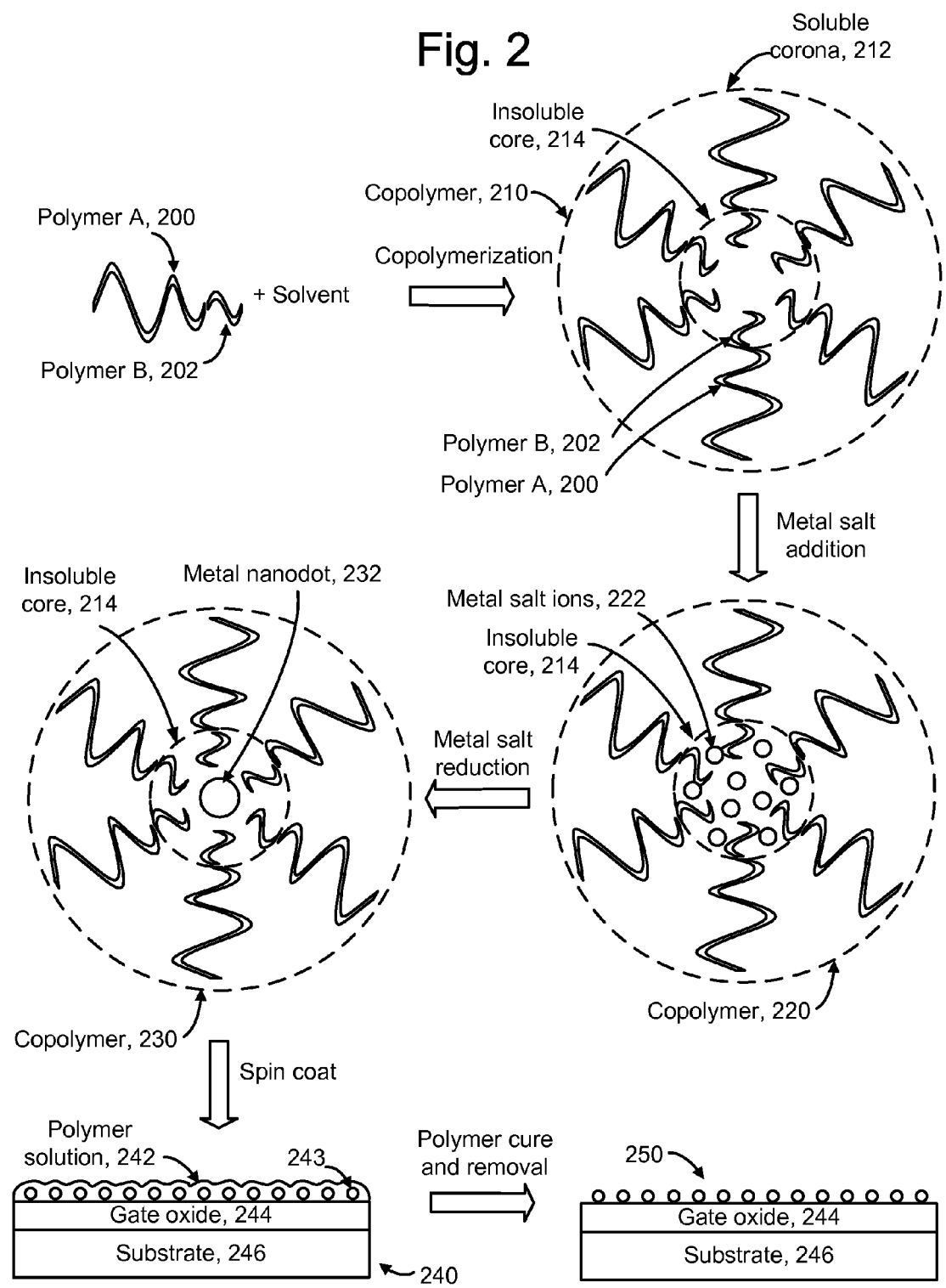
FIG. 2 depicts a process flow for providing metal nanodots in a polymer solution on a substrate.

FIG. 2 depicts a process flow for providing metal nanodots in a polymer solution on a substrate. A substance comprising a first polymer, polymer A 200 and a second polymer, polymer B 202 is depicted as being added to a solvent to perform copolymerization, thereby forming a block copolymer 210 which includes an insoluble core or cavity 214 and a soluble corona 212. Block copolymers are made up of blocks of different polymerized monomers. A diblock copolymer is a block copolymer with two distinct blocks. In this example, the copolymer includes several instances of the polymers A and B joined together end to end. Polymer A attaches to polymer B but not to another polymer A, and polymer B attaches to polymer A but not to another polymer B. In an example implementation, polymer block A is Poly Styrene (PS) and polymer block B is Poly-2Vinylpyridine (P2VP). However, other polymers may be used as well. Polymer A may be hydrophobic while polymer B is hydrophilic. An example solvent is an organic solvent such as Toluene, and an example metal salt is TetraChloroAuric acid (HAuCl4). Other example metal salts include salts of palladium (Pd), iridium (Ir), nickel (Ni), platinum (Pt), gold (Au), ruthenium (Ru), cobalt (Co), tungsten (W), tellurium (Te) and iron platinum alloy (FePt). The polymers may be in powdered form, for instance, and dissolved in the organic solvent, with an equal ratio of polymer and solvent, in one approach, stirring. A solvent such as Toluene evaporates out, even at room temperature, due to its low vapor pressure, leaving a polymer solution. Generally, the solvent dissolves the polymers and helps in copolymerization. The copolymerization may take 1-2 days to stabilize at room temperature, in one possible implementation.

The cores 214 may have a diameter of about 20-30 nm, in one possible implementation. The core size can be tailored by choosing the polymer ratio. A broad range of ratios may be used. Polymer B, which is generally the smaller polymer, controls the core size, and thus the nanodot size, and polymer A, which is generally the larger polymer, controls the spacing between cores, and thus the spacing between nanodots. Specifically, the polymer length controls the core size or spacing. The length of polymer B controls the core size, while the spacing between nanodots is set according to the length of polymer A. That is, when the ratio of the length of polymer B to the length of polymer A is relatively small, the spacing between nanodots will be relatively large. And, when the ratio of the length of polymer B to the length of polymer A is relatively large, the spacing between nanodots will be relatively small.

Moreover, the ratio of molecular weights of the polymers controls whether the core is spherical or distorted. Generally, a spherical core is desired as it allows better control of the nanodot size and spacing. A non-spherical nanodot shape such as an egg shape may result in unsymmetrical spacing between nanodots. However, non-spherical nanodots may be used as well since they still have the ability to store a charge. The term "nanodot" or "nano-particle" or the like is meant to include nano sized particles regardless of their shape.

The copolymer 220 is formed after metal salt addition. Here, a number of metal salt ions, including example metal salt ion 222, are added in the core 214. The metal salt can be in powdered or liquid form, and can be obtained from different suppliers. Generally, the core 214 can only take charged ions. There may be one or multiple molecules of the metal salt in a core depending on the size of the metal salt molecules and the size of the core. The copolymer 230 is formed after metal salt reduction, in which the negative charges are removed from the metal salt ions to form neutral metal atoms, and the atoms aggregate to form a metal nanodot 232 in the core 214. The nanodot thus may be a group of metal atoms. The size of the nanodot is a function of the number of atoms which aggregate and this, in turn, is based on the core size, as mentioned, and can be tailored to obtain a desired nanodot size and/or number of metal atoms per nanodot.

A corresponding polymer solution 242 with the nanodots 243 is spin coated onto a gate oxide 244 on a substrate 246 to form a layered semiconductor material 240. A limited amount of the polymer solution 242 may be used to obtain a monolayer of nanodots. Dip coating can also be used but may achieve a less uniform result than spin coating. At this stage, the nanodots are held in position by the polymer. Further, the nanodots are relatively heavy and sink down to rest on the gate oxide. The gate oxide 244 may comprises $SiO_2$ which is thermally grown on a silicon wafer, for instance. After polymer cure and removal, the nanodots remain on the gate oxide 244 to form the layered semiconductor material 250. The nanodots are arranged in a uniform, self-aligned 2D array or matrix on the gate oxide 244. The nanodots may be slightly surface oxidized, which helps them stick to the gate oxide surface. During the polymer cure and removal, the nanodots do not move because each nanodot is being pulled on by polymers on six sides with the same force, assuming a hexagonal configuration of polymers. When a non-spherical shape is used, the nanodots may move during the cure because they are subject to asymmetric forces.

Thus, the concept of polymer micelle formation is employed to form a self-aligned array of nanodots. In one possible implementation, the diblock co-polymer AB in a selective solvent is used to form a micelle having a completely segregated core region consisting only of block A and a shell region consisting of the solvent and the solvent compatible block B. Ionic co-block polymers may be used due to their stability in micelle formation. A wide range of metal salts can be used to introduce the negatively charged metal nanodots into the micelle cores. The metal salt reduction process uses a suitable reducing agent to help reduce the metal ions back to neutral metal dots.

Figure 3:
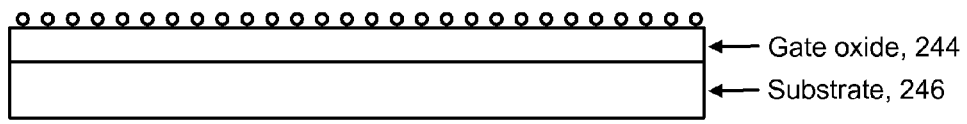
FIG. 3 depicts a layered semiconductor material in which metal nanodots are provided on a substrate.

FIG. 3 depicts a layered semiconductor material in which metal nanodots are provided on a substrate. The layered semiconductor material 250 of FIG. 2 is depicted. The metal nanodots are depicted schematically in this and other figures as small circles. The figures are not to scale.

Figure 4:
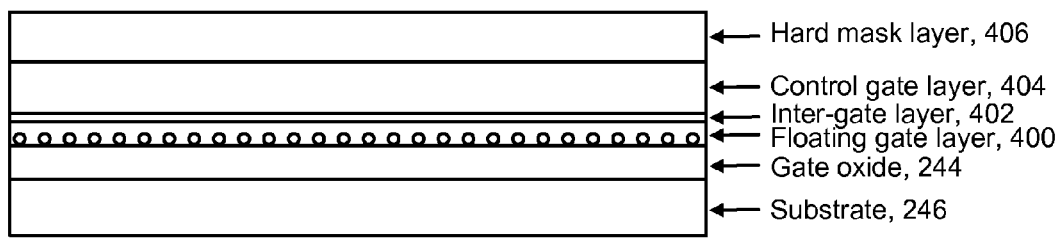
FIG. 4 depicts the layered semiconductor material of FIG. 3 after depositing a floating gate layer, inter-gate layer, control gate layer and hard mask layer.

FIG. 4 depicts the layered semiconductor material of FIG. 3 after depositing a floating gate layer 400, inter-gate layer 402, control gate layer 404 and hard mask layer 406. The floating gate layer 400 may include a high dielectric constant (high-k) material such as aluminum oxide ($Al_2O_3$), hafnium oxide (HfO2), zirconium oxide ($ZrO_2$) or combinations of these materials. Other high-k materials may be used as well. High-k materials have a relatively high dielectric constant compared to the dielectric constant of $SiO_2$. However, $SiO_2$ or other oxide for the floating gate layer is also possible. The inter-gate layer 402 may include oxide-nitride-oxide (ONO) layers, for instance. The control gate layer 404 is a conductive layer and may include metal or doped polysilicon, for instance. The hard mask layer 406 may include any suitable hard mask material.

Figure 5:
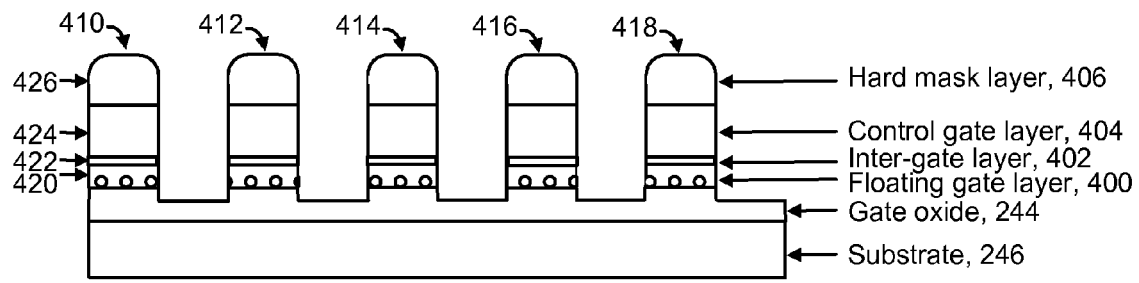
FIG. 5 depicts the layered semiconductor material of FIG. 4 after etching to the gate oxide to form a set of storage elements.

FIG. 5 depicts the layered semiconductor material of FIG. 4 after etching to the gate oxide 244 to form a set of storage elements, including example storage elements 410, 412, 414, 416 and 418. In an example NAND memory device, the storage elements may be part of a NAND string. Example storage element 410 includes a floating gate 420, a dielectric 422, a control gate 442 and hard mask portion 426. Note that each floating gate includes one or more nanodots as charge-storing elements. The number of nanodots in a floating gate depends on the size and spacing of the nanodots and the size of the floating gate. The control gates are separated and thus electrically isolated from one another. In this example, the floating gates are also separated from one another. However, this is not necessary as the nanodots are already electrically isolated from one another. See FIG. 7 for an alternative configuration. Each control gate may be part of a word line which extends to different storage elements.

Figure 6:
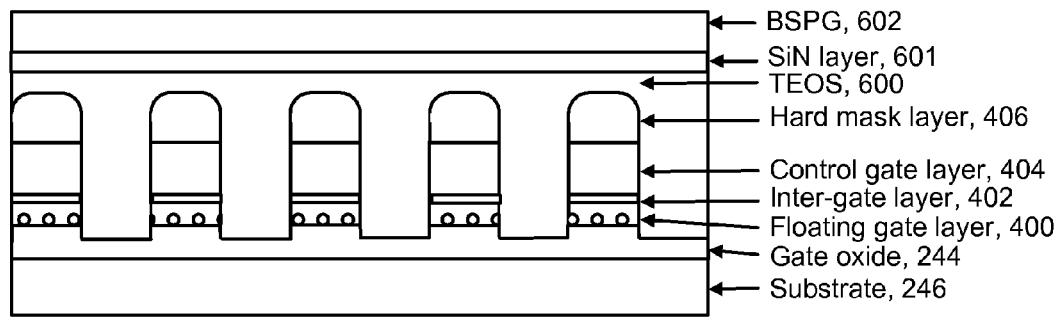
FIG. 6 depicts the layered semiconductor material of FIG. 5 after adding a gap fill dielectric, a gate protection layer and a pre-metal dielectric layer.

FIG. 6 depicts the layered semiconductor material of FIG. 5 after adding a gap fill dielectric 600 such as TEOS, a silicon gate protection layer such as SiN 601 and a pre-metal dielectric layer 602 such as BSPG. The SiN provides a protective layer to ensure that Boron does not diffuse from the BPSG. Additional process steps can be performed as needed to complete the fabrication of the memory device.

During use of the memory device, the nanodots act as charge-storing elements. For example, in non-volatile memory, a storage element is programmed by applying a voltage to a control gate, as a result of which electrons are drawn into the nanodots in the floating gate from the substrate. The nanodots hold the charge so that a threshold voltage of the storage element is altered based on the amount of charge held. The threshold voltage can be detected during a read operation and translated to a logical data state. During an erase operation, a high voltage is applied to the substrate to draw the electrons back out of the nanodots and into the substrate. Note that it is acceptable for the number of nanodots per floating gate to vary since the same amount of charge can be stored in a different number of nanodots. When there are more nanodots than average in a floating gate, less charge is stored in each nanodot. Similarly, when there are fewer nanodots than average in a floating gate, more charge is stored in each nanodot. Even one nanodot per floating gate may be adequate. The nanodots in the floating gates may store bits which represent two, four, eight or more logical states. Further, in some cases, it may be desired to have multiple levels of nanodots. See the discussion below starting with FIG. 8.

Figure 7:
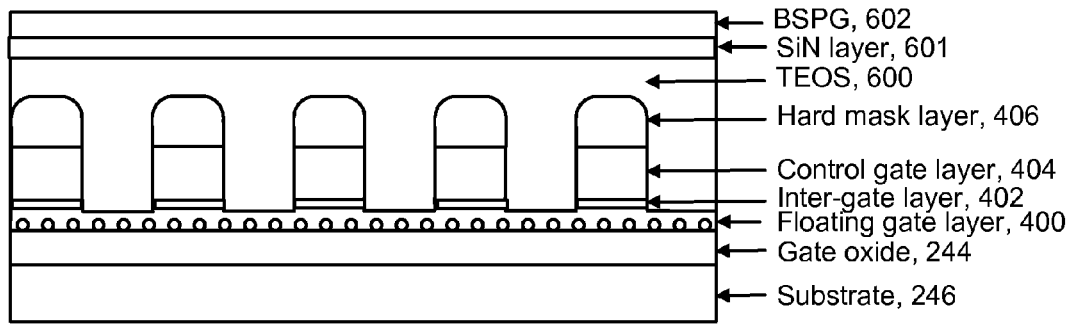
FIG. 7 depicts the layered semiconductor material of FIG. 4 after etching to the floating gate layer to form a set of storage elements.

FIG. 7 depicts the layered semiconductor material of FIG. 4 after etching to the floating gate layer to form a set of storage elements. In this approach, the etch is not as deep as in the configuration of FIG. 5 based on the realization that the nanodots are already electrically isolated from one another, so it is not necessary to physically separate the floating gates from one another. This assumes a high-k material is used for the floating gate. In contrast, if a conductive material were to be used for the floating gate, the floating gates would need to be physically separated to provide electrical isolation. The etch process can stop after the control gates have been separated. For example, the etch can stop at the inter-gate layer 402, if present, or at or near the top of the floating gate layer 400, or otherwise before reaching the metal nanodots in the floating gate layer 400. Appropriate etch processes, including the use of etch stop materials on the substrate, can be employed to control the etch depth.

Figure 8:
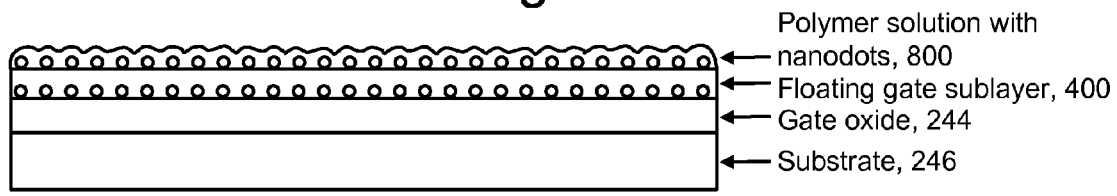
FIG. 8 depicts a layered semiconductor material in which multiple layers of metal nanodots are deposited on a substrate using a polymer solution.

FIG. 8 depicts a layered semiconductor material in which multiple layers of metal nanodots are deposited on a substrate using a polymer solution. In this example, two layers of nanodots are provided on a substrate. Additional layers of nanodots may be desired, e.g., to store a higher level of charge and/or a larger range of different charges, than one level of nanodots provides. Here, the polymer solution with nanodots 800 is applied, e.g., by spin coating, to the floating gate layer or sublayer 400. Polymer cure and removal is performed to leave a second monolayer of nanodots.

Figure 9:
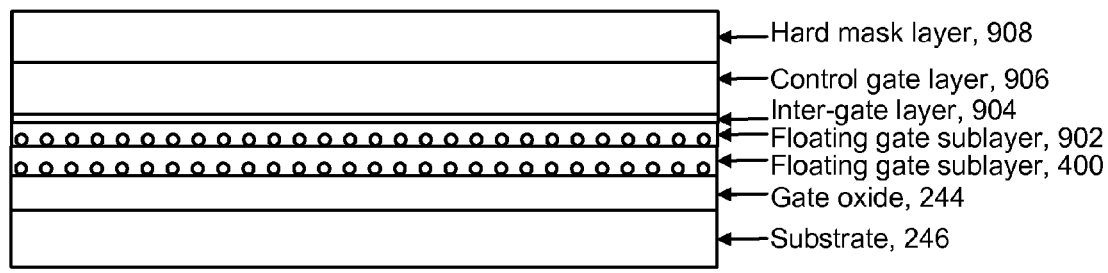
FIG. 9 depicts the layered semiconductor material of FIG. 8 after polymer cure and removal, and after depositing an additional floating gate sublayer, an inter-gate layer, a control gate layer and a hard mask layer.

FIG. 9 depicts the layered semiconductor material of FIG. 8 after polymer cure and removal, and after depositing an additional floating gate sublayer 902, an inter-gate layer 904, a control gate layer 906 and a hard mask layer 908, similar to the floating gate layer 400, inter-gate layer 402, control gate layer 404 and hard mask layer 406, respectively, of FIG. 4.

Figure 10:
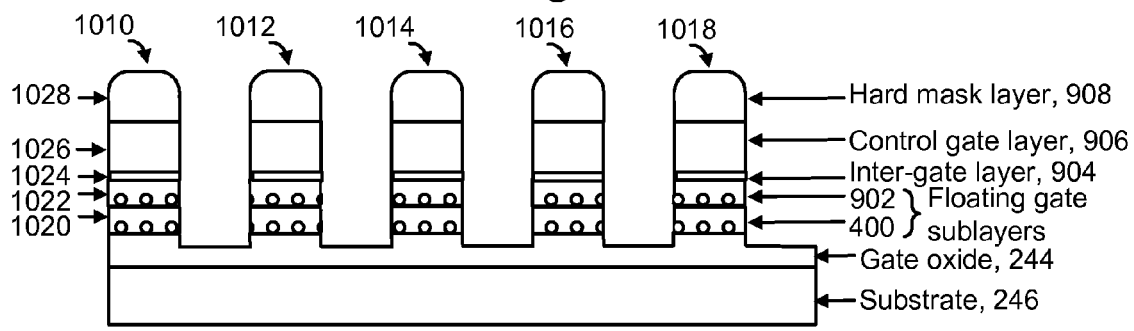
FIG. 10 depicts the layered semiconductor material of FIG. 9 after etching to the gate oxide to form a set of storage elements.

FIG. 10 depicts the layered semiconductor material of FIG. 9 after etching to the gate oxide to form a set of storage elements, including example storage elements 1010, 1012, 1014, 1016 and 1018. Example storage element 1010 includes a first floating gate sublayer portion 1020 and a second floating gate sublayer portion 1022, which collectively form the overall floating gate, an inter-gate layer portion 1024, a control gate 1026 and a hard mask portion 1028.

Figure 11:
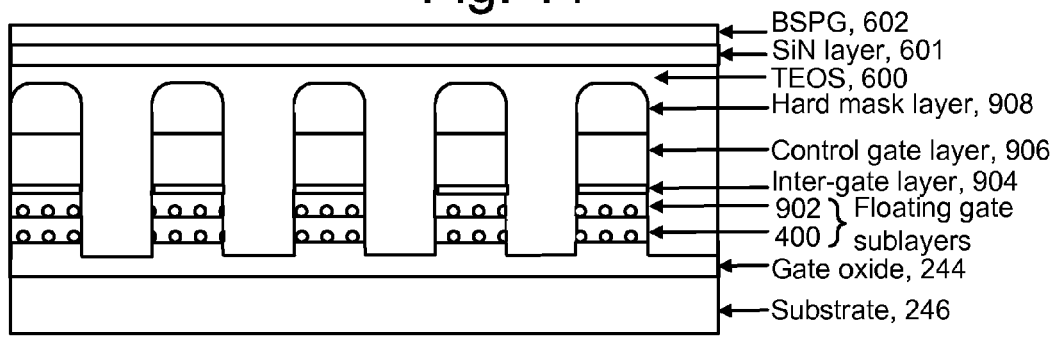
FIG. 11 depicts the layered semiconductor material of FIG. 10 after adding a gap fill dielectric, a gate protection layer and a pre-metal dielectric layer.

FIG. 11 depicts the layered semiconductor material of FIG. 10 after adding a gap fill dielectric such as TEOS 600, a gate protection layer such as silicon nitride (SiN) layer 601 and a pre-metal dielectric layer 602 such as BSPG.

Figure 12:
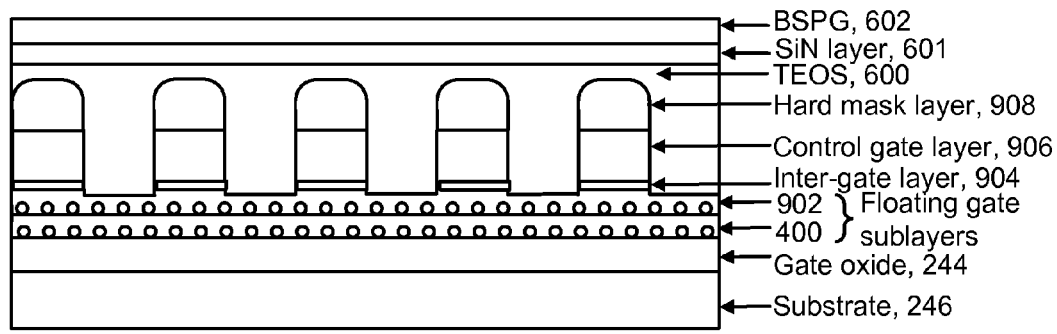
FIG. 12 depicts the layered semiconductor material of FIG. 9 after etching to the top of the floating gate layer to form a set of storage elements.

FIG. 12 depicts the layered semiconductor material of FIG. 9 after etching to the top of the floating gate layer to form a set of storage elements. In this alternative approach, the etch is not as deep as in the configuration of FIG. 10 based on the realization that the nanodots are already electrically isolated from one another, so it is not necessary to physically separate the floating gates from one another. The etch process can stop after the control gates have been separated. For example, the etch can stop at the inter-gate layer 904, if present, or at or near the top of the floating gate layer sublayer 902, or otherwise before reaching the nanodots in the floating gate layer sublayer 902. Appropriate etch processes, including the use of etch stop materials on the substrate, can be employed to control the etch depth.

Applying Nanodots Using a Coupling Agent

In another approach, nanodots are applied to a substrate using a coupling agent on the substrate. For example, a coupling layer including an amino functional silane group may be provided on a gate oxide on a substrate. The substrate may then be dip coated in a citrate metal aqueous colloidal solution which includes nanodots to form a controlled mono-layer of self aligned metal nanodots on the coupling layer. The coupling layer is then rinsed, leaving the nanodots on the gate oxide. Further details are discussed next.

Figure 13:
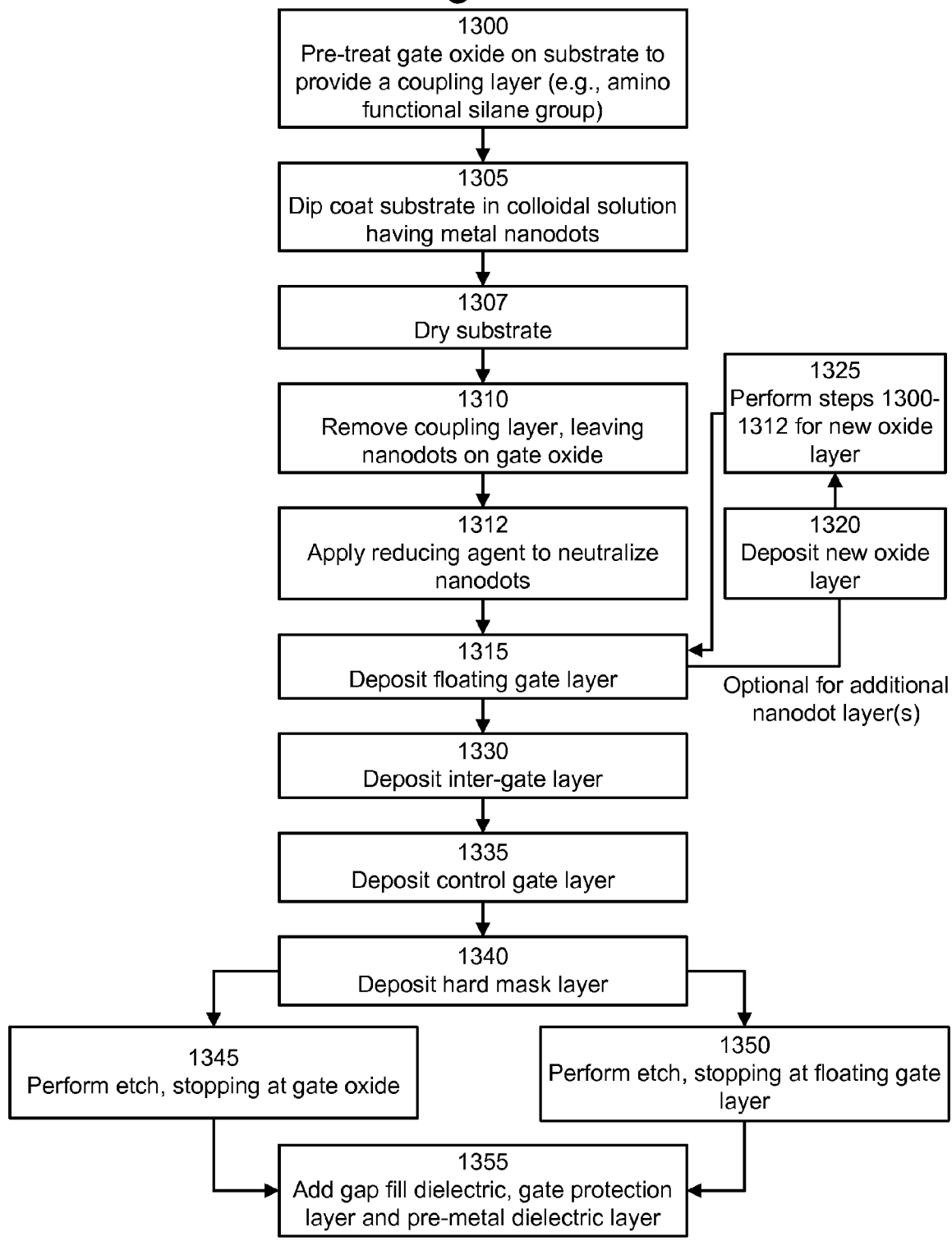
FIG. 13 depicts another embodiment of a process for forming memory having charge-storing nanodots.

FIG. 13 depicts another embodiment of a process for forming memory having charge-storing nanodots. Step 1300 includes pre-treating a gate oxide on a substrate to provide a coupling layer such as an amino functional silane group. Step 1305 includes dip coating the substrate in a colloidal solution having metal nanodots, while stirring. The metal nanodots react with the coupling layer, becoming negatively charged. Step 1307 includes drying the substrate and the metal nanodots, such as by taking the substrate out of the solution and drying it using a dry nitrogen blowing process, without adding heat. Step 1310 includes removing the coupling layer, leaving the nanodots on the gate oxide. For example, the coupling layer may be removed by rinsing. Note that, depending on the coupling agent, it may be possible to remove it by blowing dry nitrogen as well. However, a post rinse is recommended to make sure that no coupling agent remains. Step 1312 includes applying a reducing agent to neutralize the charges on the nanodots. The removal of the coupling layer and the reducing of the negative charge can be considered to be two processes, which can occur at the same time, at least in part, in one approach, or separately. Generally, the reducing should not occur before the rinsing to prevent the nanodots from sticking to each other or otherwise become misaligned, since the charge helps maintains the nanodots in a uniform 2D grid.

Step 1315 includes depositing a floating gate layer. Optionally, multiple layers of nanodots can be provided as indicated at step 1320, in which a new oxide layer is deposited over a first floating gate sublayer of nanodots, and steps 1300-1310 are performed for the new oxide layer. This process can be repeated multiple times if desired to provide multiple layers of nanodots. Generally, when first floating gate layer sublayer includes a high-k material, the new oxide layer is added since the coupling layer reacts with oxide and not the high-k material.

Step 1330 includes depositing an inter-gate dielectric layer, step 1335 includes depositing a control gate layer and step 1340 includes depositing a hard mask layer. Once the hard mask layer has been applied at step 1340, the layered material is etched to form memory elements. In one approach, at step 1345, the etch stops at the gate oxide so that a separate stack is formed for each memory element, including a separate floating gate and control gate. In another approach, at step 1350, the etch stops at the inter-gate layer, or at or near the top of the floating gate layer, or otherwise before reaching the nanodots, so that the control gates of the memory elements are separated from one another but the floating gates remain connected in a continuous nanodot-populated layer. Step 1355 includes adding a gap fill dielectric, gate protection layer and pre-metal dielectric layer. Further details of the process of FIG. 13 are discussed next.

Figure 14:
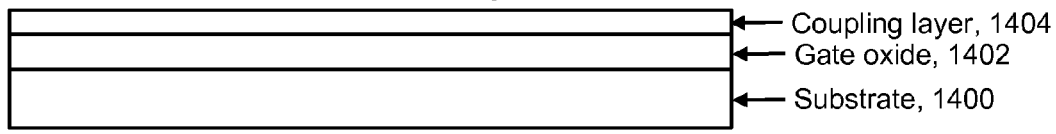
FIG. 14 depicts a layered semiconductor material which includes a coupling layer on a substrate.

FIG. 14 depicts a layered semiconductor material which includes a coupling layer on a substrate. A gate oxide 1402 may comprises $SiO_2$ which is thermally grown on a silicon wafer substrate 1400, for instance. A coupling layer 1404 including an amino functional silane group may be provided on the gate oxide 1402 as a surface pre-treatment. Nanodots 1500 are provided on the coupling layer 1404 by dipping the substrate in a citrate metal colloidal solution having metal nanodots. Citrate metal colloidal solution, available from suppliers, is a neutral, aqueous, chlorine based salt. The nanodots are mixed in at high speed to form a colloidal dispersed solution. The metal nanodot colloidal particles may have sizes in the nanometer range. The dot size depends on the solution, and can range from about 1-1500 nm, for instance, or, in smaller devices, from about 1 to 30 nm. Further, the nanodot spacing is defined by the functional group. Different functional groups have different site spacings to which the nanodots attach, becoming negatively charged when they attach to the sites. The nanodot spacing is thus defined by the spacing of the sites in the coupling layer.

Further, unlike metal nanodots which are deposited on a substrate by sputtering, chemical vapor deposition (CVD), ion-beam deposition or by drilling of micro-holes, dip coating in a colloidal solution results in a very good size controllability, with a standard deviation of, e.g., 1%, and can be controlled to provide a monolayer. Moreover, the citrate metal solution (aqueous colloidal solution containing metal particles) is readily suspended in solution to pre-treat the oxide surface. Upon suspension, the metal nanodots become negatively charged so that an initial monolayer of metal nanodots which is deposited on the coupling layer 1404 repels the deposition or sticking of a second layer of nanodots (see also FIG. 16).

Another option is to spray charged atomized nanodots onto the coupling layer, although this may result in a less uniform distribution. This can be done at room temperature or higher, e.g., for a couple of hours. Higher temperatures speed up the process.

Figure 15:
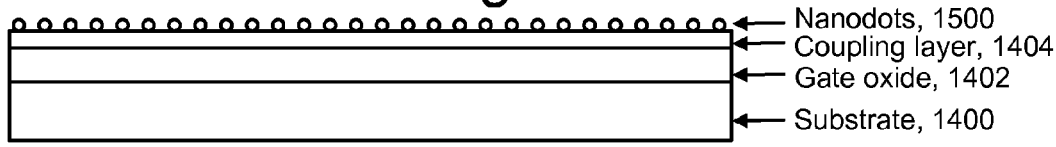
FIG. 15 depicts the layered semiconductor material of FIG. 14 after metal nanodots have been deposited by dip coating the substrate in a colloidal solution.

FIG. 15 depicts the layered semiconductor material of FIG. 14 after metal nanodots 1500 have been deposited by dip coating the substrate in a colloidal solution. The metal nanodots rest on the coupling layer 1404.

Figure 16:
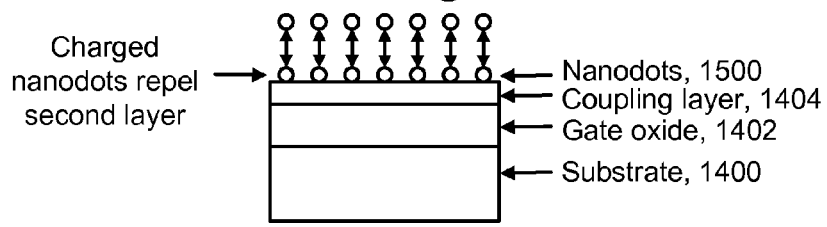
FIG. 16 indicates how a monolayer of negatively charged metal nanodots is formed on the layered semiconductor material of FIG. 15 by repelling a second layer of nanodots.

FIG. 16 indicates how a monolayer of negatively charged metal nanodots is formed on the layered semiconductor material of FIG. 15 by repelling a second layer of nanodots. Here, the layer of nanodots 1500 is shown repelling a second layer. Due to the charges on the metal nanodots which are generated when the nanodots react with the coupling layer, a monolayer of nanodots can be formed. Further, the repelling charge acts on each nanodot on the coupling layer 1404 as well to hold the nanodots in a regular, uniformly spaced 2D array.

Figure 17:
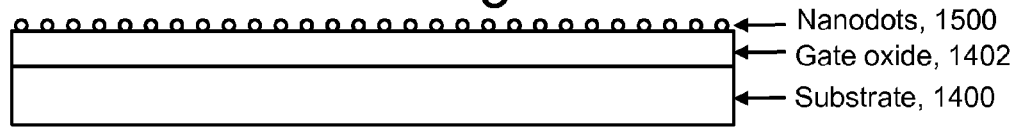
FIG. 17 depicts the layered semiconductor material of FIG. 15 after removing the coupling layer so that the metal nanodots rest on the gate oxide.

FIG. 17 depicts the layered semiconductor material of FIG. 15 after removing the coupling layer so that the metal nanodots rest on the gate oxide. Once the coupling agent is removed, e.g., dissolved, such as by rinsing, the nanodots rest on the gate oxide layer 1402. Further, the layered semiconductor material of FIG. 17 is analogous to that in FIG. 3, so the additional fabrication techniques discussed previously can be used to produce a series of storage elements in which the nanodots are charge-storing elements. For example, the memory devices of FIG. 6 or 7 can be fabricated.

Figure 18:
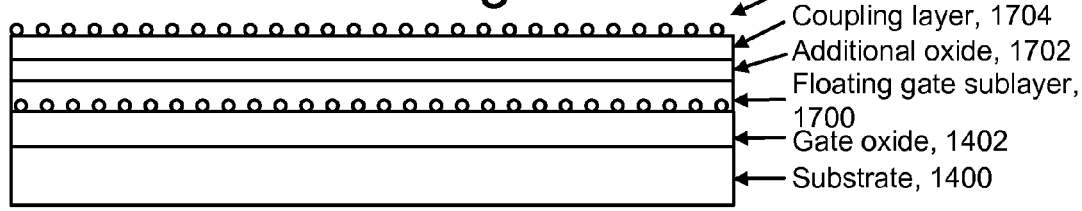
FIG. 18 depicts a layered semiconductor material in which multiple layers of metal nanodots are deposited on a substrate using coupling layers.

FIG. 18 depicts a layered semiconductor material in which multiple layers of metal nanodots are deposited on a substrate using coupling layers. Here, a floating gate sublayer 1700 is formed, such as by depositing a high-k material on the gate oxide layer 1402. The high-k material encompasses the nanodots. An additional oxide layer 1702 is then deposited on the floating gate sublayer 1700, and a coupling layer is provided on the oxide layer 1702, such as by pre-treating the oxide layer 1702 with an amino functional silane group. The substrate is then dipped in the metal colloidal solution to provide the nanodots 1706 on the coupling layer 1704. As mentioned, when first floating gate sublayer includes a high-k material, the additional oxide layer is added since the coupling layer reacts with oxide and not the high-k material.

In another approach, a high-k layer is provided between the floating gate sublayer 1700 and the additional oxide layer 1702.

Figure 19:
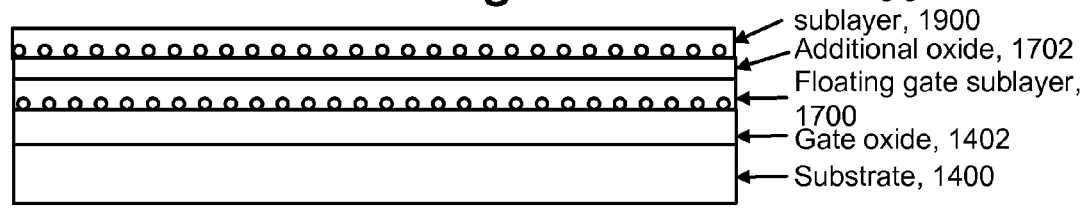
FIG. 19 depicts the layered semiconductor material of FIG. 18 after removing the coupling layer so that the metal nanodots rest on the additional oxide.

FIG. 19 depicts the layered semiconductor material of FIG. 18 after removing the coupling layer 1704 so that the metal nanodots 1706 rest on the additional oxide layer 1702. A second floating gate sublayer 1900 is also provided on the additional oxide layer 1702, encompassing the nanodots.

Additional fabrication techniques as discussed previously can be used to produce a series of storage elements in which the nanodots are charge-storing elements. For example, an inter-gate layer, control gate layer and hard mask layer similar to those shown in FIG. 9 can be provided on the semiconductor material of FIG. 19, and an etch performed similar to what is shown in FIG. 10. The resulting material will be as depicted in FIG. 11 of FIG. 12 except for the additional oxide layer between the floating gate sublayers.

In an example implementation, the pre-treatment amino functional group is Aminoethylamino Propyl Trimethoxy Silane (APTS), the metal colloidal solution is Aqueous Citrate Gold solution, and removal of the functional group is by dry nitrogen blowing to remove the colloidal solution. Further, examples of nanometer-sized colloidal metal nanoparticles which may be used include palladium (Pd), iridium (Ir), nickel (Ni), platinum (Pt), gold (Au), ruthenium (Ru), cobalt (Co), tungsten (W), tellurium (Te) and iron platinum alloy (FePt). Such materials are available from suppliers. In an example configuration, nanodots with a diameter of 2 nm are evenly spaced on a substrate with a density of $1 \times 10^{12}$ nanodots/cm$^2$.

With the concept of functional chemistry to arrange metal nanodots on a pre-treated surface, no polymer material is used, so post curing and cleaning steps are not required. In an example implementation, an amino functional silane is employed as a coupling agent. However, there are wide ranges of functional silanes that can be used for the pre-treatment. The treated surface is oxidized with hydroxyl terminal groups as this plays a major role in helping the functional group silane to adhere to the oxide surface. With this pre-treatment, a variety of aqueous metal colloidal solutions can be used to introduce metal nanodots into active sites in the functional layer. The nanodots react with the functional silane to form a linking layer. The size and type of metal nanodot can be pre-determined by properly choosing the aqueous solution. The nanodots are charge neutral atoms in the colloidal solution, but gain a negative charge after suspension onto the functional group due to reaction with the functional group. This helps to prevent a second layer of nanodots or a distorted arrangement of nanodots.

As mentioned, the functional group can be removed by use of a suitable solvent, which may include a reducing agent which changes the negatively charged nanodot ions into neutral atoms. Optionally, by omitting use of the reducing agent, the negative charge on the nanodots can be maintained while the functional group of the coupling layer is removed. In this case, the negatively charged nanodots are present in the final device and can be removed, e.g., by an erase operation in which a high voltage is applied to the substrate, drawing electrons out of the nanodots in the floating gate. This approach can be achieved by the process of FIG. 13 by omitting step 1312.

Amino functional silanes are an example of an association group which acts as a coupling agent for the nanodots. In an example implementation, these amino functional silanes do not have any nano structure or particles within them, but only serve as a coupling agent. Further, in the example implementation, we do not spin coat any nano structure solution directly onto the substrate. Instead, we initially start with surface preparation by chemically treating the surface with a coupling agent. Then we immerse the prepared substrates in a colloidal solution that carries the nano-particles. The presence of the coupling agent activates the attachment of nanoparticles present within the colloidal solution on to the activated substrate. Note that the particles are negatively charged and this helps in providing a mono layer since a second layer is repelled. The removal of charge from the nanodots is achieved either during the coupling agent rinse or later on using a common erase operation. This full process approach is different from approaches which use pre-loaded association groups containing nano-particles and spin coating of a nano-particle solution after the association group is formed on a substrate. Separating the depositing of the association group from the depositing of the nanodots allows each process to be optimized and controlled separately.

A further option involves providing one or more layers of nanodots using the polymer approach and one or more layers of nanodots using the coupling agent approach.

As mentioned, the techniques provided herein are applicable to any memory device which uses a charge-storing element, including non-volatile memory such as NAND flash memory and volatile memory such as DRAM.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating a memory device, comprising:
applying a polymer solution on a substrate, the polymer solution comprising a copolymer with metal particles carried in cavities of the copolymer, the copolymer comprising first and second polymers, the first polymer is larger than the second polymer;
removing at least a portion of the polymer solution from the substrate, leaving the metal particles in a uniform grid on the substrate, a spacing between the metal particles in the uniform grid is set according to a length of the first polymer; and
forming memory elements on the substrate in which the metal particles are charge-storing elements.

2. The method of claim 1, wherein:
the metal particles are spherical and have a size of about 1 to 30 nm.

3. The method of claim 1, wherein:
the polymer solution is formed by dissolving the copolymer in a solvent, and evaporating out the solvent, leaving the polymer solution.

4. The method of claim 1, wherein:
each memory element comprises a floating gate, each floating gate comprises, on average, at least one of the metal particles.

5. The method of claim 1, further comprising:
providing a floating gate layer above the substrate which encompasses the metal particles, at least in part;
providing an inter-gate layer above the floating gate layer;
providing a control gate layer above the inter-gate layer; and
etching through the control gate layer and the inter-gate layer to form spaced apart portions of the control gate layer and the inter-gate, respectively, but stopping before reaching the metal particles in the floating gate layer, the spaced apart portions of the control gate layer comprise word lines.

6. The method of claim 1, wherein:
the polymer solution is applied to a gate oxide layer.

7. The method of claim 1, wherein:
the metal particles are spaced apart in a uniform 2d grid on the substrate.

8. The method of claim 1, wherein:
the polymer solution is spun coat or dip coat onto the substrate.

9. The method of claim 1, wherein:
the copolymer is a block copolymer.

10. The method of claim 9, wherein:
the block copolymer comprises a hydrophobic polymer and a hydrophilic polymer.

11. The method of claim 9, wherein:
the block copolymer comprises Poly Styrene and Poly-2Vinylpyridine.

12. The method of claim 1, wherein:
a size of the metal particles is set according to a length of the second polymer.

13. The method of claim 1, further comprising:
removing substantially all of the polymer solution from the substrate.

14. A method for fabricating a memory device, comprising:
forming a first layer of metal particles on the substrate, the metal particles in the first layer are carried in cavities of the copolymer solution;
removing at least a portion of the copolymer solution in which the metal particles in the first layer are carried, leaving the first layer of metal particles on the substrate;
providing a first floating gate sublayer above the substrate which encompasses the first layer of metal particles, at least in part;
forming a second layer of metal particles above the first floating gate sublayer, the metal particles in the second layer are carried in cavities of a copolymer solution;
removing at least a portion of the copolymer solution in which the metal particles in the second layer are carried, leaving the second layer of metal particles above the first floating gate sublayer;
providing a second floating gate sublayer above the first floating gate sublayer which encompasses the second layer of metal particles, at least in part; and
forming non-volatile storage elements on the substrate, the first and second layers of metal particles are provided in floating gates of the non-volatile storage elements.

15. The method of claim 14, wherein:
the first and second layers of metal particles comprise respective monolayers of metal particles.

16. The method of claim 14, further comprising:
providing an inter-gate layer above the second floating gate sublayer;
providing a polysilicon layer above the inter-gate layer; and
etching through the control gate layer to form spaced apart portions of the control gate layer, but stopping before reaching the second layer of metal particles.

17. The method of claim 16, wherein:
the spaced apart portions of the control gate layer comprise word lines.

18. The method of claim 14, wherein:
the copolymer solution is applied to a gate oxide layer.

19. The method of claim 14, wherein:
the metal particles are spherical and have a size of about 1 to 30 nm.

20. The method of claim 14, wherein:
the copolymer solution comprises a block copolymer.

21. A method for fabricating a memory device, comprising:
adding metal salt ions to cavities in a copolymer solution comprising first and second polymers;
reducing the metal salt ions to form charge neutral metal particles in the cavities;
coating a substrate with the copolymer solution so that the charge neutral metal particles are spaced apart and arranged in a uniform grid on the substrate;
removing at least a portion of the copolymer solution by curing, thereby leaving the charge neutral metal particles arranged in the uniform grid on the substrate, a spacing between the charge neutral metal particles in the uniform grid is set according to a length of one of the first and second polymers; and
forming storage elements on the substrate, each storage element includes, on average, at least one of the charge neutral metal particles.

22. The method of claim 21, wherein:
the charge neutral metal particles are provided in floating gates of the storage elements.

23. The method of claim 21, wherein:
the charge neutral metal particles have a size of about 1 to 30 nm.

24. The method of claim 21, wherein:
the copolymer solution comprises a block copolymer.

* * * * *